United States Patent [19]

Horng

[11] Patent Number: 5,297,929
[45] Date of Patent: Mar. 29, 1994

[54] SUPER THIN SMALL HEAT DISPERSING FAN

[76] Inventor: Alex Horng, No. 149, Yi-Yung Rd., Lin Ya Dist., Kaohsiung, Taiwan

[21] Appl. No.: 999,372

[22] Filed: Dec. 30, 1992

[51] Int. Cl.⁵ ............................................. F01D 15/00
[52] U.S. Cl. .................................. 415/121.3; 361/695
[58] Field of Search ............ 310/40 MM, 71; 439/59, 439/62, 65; 415/121.3; 361/384, 400, 405

[56] References Cited

U.S. PATENT DOCUMENTS

| | | | |
|---|---|---|---|
| 4,363,077 | 12/1982 | Brown | 361/400 |
| 4,733,115 | 3/1988 | Barone et al. | 361/400 |
| 4,885,488 | 12/1989 | Cox | 361/384 |
| 5,031,071 | 7/1991 | Seibert et al. | 361/405 |
| 5,068,962 | 12/1991 | Germer et al. | 361/405 |
| 5,079,438 | 1/1992 | Heung | 361/384 |

FOREIGN PATENT DOCUMENTS

| | | | |
|---|---|---|---|
| 0148203 | 11/1979 | Japan | 310/71 |
| 4-043700 | 2/1992 | Japan | 361/400 |

OTHER PUBLICATIONS

IBM Technical Disclosure Bulletin vol. 27, No. 11 Apr. 1985.

Primary Examiner—Edward K. Look
Assistant Examiner—Mark Sgantzos
Attorney, Agent, or Firm—Jacobson, Price, Holman & Stern

[57] ABSTRACT

A super thin small heat dispersing fan having a plate foot extending down from a bottom of a circuit board, the plate foot either inserting in a socket or directly soldered on a base plate so as to secure the fan and to conduct electric power at the same time.

4 Claims, 2 Drawing Sheets

SUPER THIN SMALL HEAT DISPERSING FAN

BACKGROUND OF THE INVENTION

A conventional small heat dispersing fan is generally secured by means of screws or rivets, and such extra hardware is inconvenenient and makes it impossible to reduce dimensions of the fan.

SUMMARY OF THE INVENTION

This invention has been devised to provide a super thin and small heat dispersing fan having a plate foot extending down from a bottom of a circuit board of the fan, and a socket for the plate foot to fit securely, therein so that the fan can be stabilized and can be energized with electric power at the same time. The plate foot has two copper foils attached on its surface serving as the positive and negative poles. Two metal feet are soldered with the copper foils for securing the fan and for conducting electric power at the same time. In addition, a lead wire is soldered with the copper foils on the plate foot, extending out through a position opening in the rear of the position of the fan so that the lead wire can be managed.

DETAILED DESCRIPTION OF THE INVENTION

Figure 1:
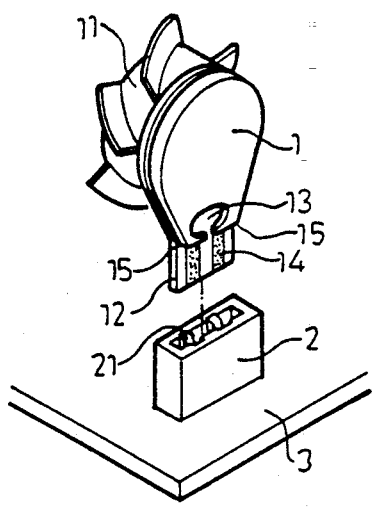
FIG. 1 is an exploded perspective view of a first embodiment of a super thin small heat dispersing fan in accordance with the present invention.
Figure 2:
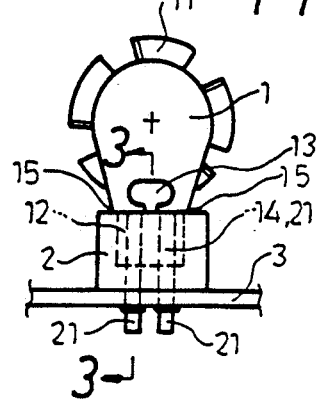
FIG. 2 is a rear view of the first embodiment of the first emboidment of a super thin small heat dispersing fan in accordance with the present invention.
Figure 3:
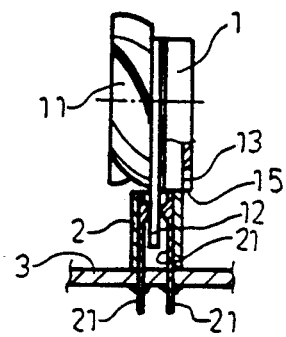
FIG. 3 is a cross-sectional view of line 3—3 in FIG. 2.

A first embodiment of a super thin small heat dispersing fan in accordance with the present invention, is shown in FIGS. 1, 2 and 3. The fan 1 comprises a fan blade 11 projecting laterally outward, a plate foot 12 extending down from a bottom of a circuit board to be inserted in or soldered with a socket 2. The socket 2 has two metal elastic contact plates 21, pressingly contacting two copper foil strips-one serving as the positive pole and the other as the negative pole in the base plates. A position opening 13 is provided in a surface of a rear plate, and a bottom of the position opening 13 forms a flat straight abutting surface. The surface 15 sits horizontally on an upper flat surface of the socket and once the plate foot 12 is inserted into the socket 2, it serves to prevent the blade 11 from touching the socket 2. When the socket 2 is inserted in and secured to the base plate 3, electric power is supplied to the base plate 3 and conducted to the two poles in the foot 12 via the two metal elastic plates 21. Thus electric power is supplied to the heat dispersing fan.

Figure 4:
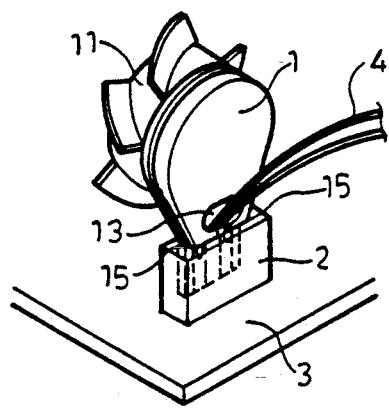
FIG. 4 is a perspective view of a second embodiment of a super thin small heat dispersing fan in accordance with the present invention.
Figure 5:
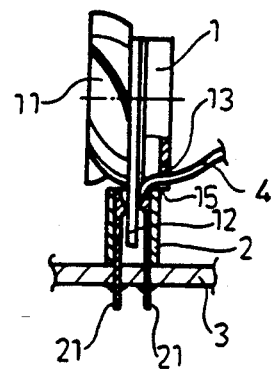
FIG. 5 is a cross-sectional view of the second embodiment of a super thin small heat dispersing fan in accordance with the present invention.

Next, FIGS. 4 and 5 show a second embodiment of a super thin small heat dispersing fan in the present invention. The second embodiment is almost the same as the first one, except an additional lead wire 4 is soldered with the two copper foils 14 for connection to a power cord. The lead wire 4 extends through the position opening 13 in the rear of the fan 1, being maintain in a substantially fixed position.

Figure 6:
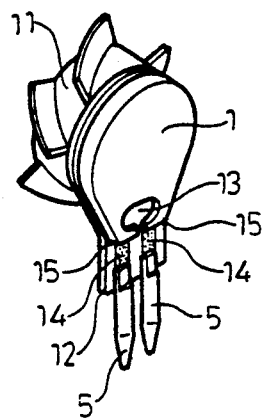
FIG. 6 is a perspective view of a third embodiment of a super thin small heat dispersing han in accordance with the present invention.
Figure 7:
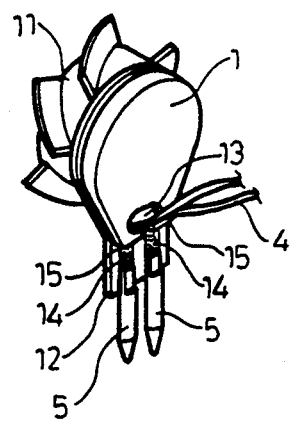
FIG. 7 is another perspective view of the third embodiment of a super thin small heat dispersing fan in accordance with the present invention.

A third embodiment of a supper thin small heat dispersing fan is shown in FIGS. 6 and 7. In this embodiment two metal feet 5 soldered on the copper foils 14, and then are inserted and soldered insertingly in the base plate 3, or to be inserted in another kind of securing base or directly connected with a power cord. The lead wire 4 featured in the second embodiment can also be added to the third embodiment, extending through the opening 13.

What is claimed is:

1. A super thin small heat dispersing fan for connection to a base plate having a socket with two contact plates therein, the fan comprising:
    an electrically powered fan blade member oriented for rotation in a plane transverse to said base plate;
    a plate foot;
    positive and negative poles comprised of copper foil strips attached on the plate foot for connection to electrical power supply to energize said fan blade member;
    an abutting surface disposed on said plate foot and oriented substantially parallel to an upper surface of said socket;
    the plate foot for insertion into said socket and thereby secured to said base plate, the abutting surface resting on the upper surface of said socket so as to provide sufficient clearance between said fan blade member and said socket, said positive and negative poles making contact with said two contact plates, respectively, in said socket; and
    a lead wire for conducting electrical power, and a positioning opening in said plate foot through which said lead wire passes and which is soldered to said copper foil strips, said positioning opening being shaped to retain and substantially fix said lead wire at said plate foot.

2. The super thin small heat dispersing fan of claim 1, wherein said positioning opening is disposed on said plate foot immediately adjacent and above the abutting surface so as to stabilize the lead wire from movement at said plate foot.

3. The super thin small heat dispersing fan of claim 2, wherein said positioning opening is substantially circular with a small gap defined therein which divides the abutting surface into two laterally spaced parallel surfaces.

4. In combination, a super thin small heat dispersing fan and a base plate having a socket which rises above the surface of the base plate for receiving and securing said fan, the fan comprising a plate foot, an electrically powered fan blade member for rotation in a plane transverse to said base plate, positive and negative poles comprised of copper foil strips attached on the foot plate for supplying electrical power to said electrically rotated fan blade member, an abutting surface disposed on said plate foot and oriented substantially parallel to an upper surface of said socket, the plate foot for insertion into said socket and thereby secured to said base plate, the abutting surface resting on the upper surface of said socket so as to provide sufficient clearance between said fan blade member and said socket, said positive and negative poles making contact with said two contact plates, respectively, in said socket and further comprising a lead wire for conducting electrical power, and a positioning opening in said plate foot through which said lead wire passes and which is soldered to said copper foil strips, said positioning opening being shaped to retain and substantially fix said lead wire at said plate foot.

* * * * *